US006624494B2

(12) United States Patent
Blanchard et al.

(10) Patent No.: US 6,624,494 B2
(45) Date of Patent: Sep. 23, 2003

(54) METHOD FOR FABRICATING A POWER SEMICONDUCTOR DEVICE HAVING A FLOATING ISLAND VOLTAGE SUSTAINING LAYER

(75) Inventors: Richard A. Blanchard, Los Altos, CA (US); Jean-Michel Guillot, Cloyne (IE)

(73) Assignee: General Semiconductor, Inc., Melville, NY (US)

(*) Notice: Subject to any disclaimer, the term of this patent is extended or adjusted under 35 U.S.C. 154(b) by 0 days.

(21) Appl. No.: 10/264,951

(22) Filed: Oct. 4, 2002

(65) Prior Publication Data

US 2003/0068863 A1 Apr. 10, 2003

Related U.S. Application Data

(62) Division of application No. 09/970,972, filed on Oct. 4, 2001, now Pat. No. 6,465,304.

(51) Int. Cl.[7] .......................... H01L 23/58; H01L 29/00; H01L 29/167; H01L 29/207; H01L 31/075; H01L 31/105

(52) U.S. Cl. ........................ 257/493; 257/495; 257/509; 257/510; 257/655; 257/656

(58) Field of Search ................................. 257/493, 492, 257/495, 655, 656, 509, 510, 379

(56) References Cited

U.S. PATENT DOCUMENTS

| | | | |
|---|---|---|---|
| 4,140,558 A | 2/1979 | Murphy et al. | 257/517 |
| 4,569,701 A | 2/1986 | Oh | 148/DIG. 35 |
| 4,711,017 A | 12/1987 | Lammert | 148/DIG. 147 |
| 5,108,783 A | 4/1992 | Tanigawa et al. | 438/359 |
| 5,216,275 A | 6/1993 | Chen | 257/493 |
| 5,701,026 A * | 12/1997 | Fujishima et al. | 257/510 |
| 6,310,365 B1 * | 10/2001 | Chen | 257/111 |
| 6,495,421 B2 * | 12/2002 | Luo | 438/269 |
| 2001/0026977 A1 | 10/2001 | Hattori et al. | 438/268 |

OTHER PUBLICATIONS

N. Cezac et al., "A New Generation of Power Unipolar Devices: the Concept fo the Floating Islands MOS Transistor (FLIMOST)," Proceedings of the ISPSD, May 2000, pp. 69–72.

X. Chen et al., "A Novel High–Voltage Sustaining Structure with Buried Oppositely Doped Regions," IEEE Transactions on Electron Devices, vol. 47, No. 6, Jun. 2000, pp. 1280–1285.

* cited by examiner

Primary Examiner—John F. Niebling
Assistant Examiner—Ron Pompey
(74) Attorney, Agent, or Firm—Mayer Fortkort & Williams, PC; Stuart H. Mayer, Esq.

(57) ABSTRACT

A power semiconductor device and a method of forming the same is provided. The method begins by providing a substrate of a first conductivity type and then forming a voltage sustaining region on the substrate. The voltage sustaining region is formed by depositing an epitaxial layer of a first conductivity type on the substrate and forming at least one trench in the epitaxial layer. A barrier material is deposited along the walls of the trench. A dopant of a second conductivity type is implanted through the barrier material into a portion of the epitaxial layer adjacent to and beneath the bottom of the trench. The dopant is diffused to form a first doped layer in the epitaxial layer and the barrier material is removed from at least the bottom of the trench. The trench is etched through the first doped layer and a filler material is deposited in the trench to substantially fill the trench, thus completing the voltage sustaining region. At least one region of the second conductivity type is formed over the voltage sustaining region to define a junction therebetween.

15 Claims, 7 Drawing Sheets

CONVENTIONAL MOSFET

THE SPECIFIC ON-RESISTANCE OF A VERTICAL DMOS TRANSISTOR WITH THE DOPANT DISTRIBUTION OF FIG. 1

STEP

1. EPITAXIAL DEPOSITION
2. FORM BARRIER LAYER
3. MASK AND ETCH BARRIER LAYER
4. ETCH THE TRENCH

STEP

5. GROW AN OXIDE LAYER
6. IMPLANT DOPANT

STEP

7. HIGH TEMPERATURE DIFFUSION
8. ETCH OXIDE AT TRENCH BOTTOM

STEP

9. REPEAT THE TRENCH ETCH STEP, THE OXIDE GROWTH STEP, THE DOPANT INTRODUCTION STEP, THE DRIVE-IN STEP, AND THE OXIDE ETCH STEP AS MANY TIMES AS REQUIRED

10. PERFORM THE OXIDE GROWTH STEP, THE DOPANT INTRODUCTION STEP, THE DRIVE-IN STEP, AND THE OXIDE ETCH STEP FOR THE LAST FLOATING ISLAND LAYER

STEP

11. REMOVE THE OXIDE FROM THE TRENCH BOTTOM TRENCH ETCH (THROUGH THE DIFFUSED P-TYPE LAYER)

STEP

12. FILL THE TRENCH
13. PLANARIZE THE WAFER

METHOD FOR FABRICATING A POWER SEMICONDUCTOR DEVICE HAVING A FLOATING ISLAND VOLTAGE SUSTAINING LAYER

STATEMENT OF RELATED APPLICATIONS

This application is a division of U.S. patent application Ser. No. 09/970,972 entitled "Method For Fabricating A Power Semiconductor Device Having A Floating Island Voltage Sustaining Layer" filed on Oct. 4, 2001 now U.S. Pat. No. 6,465,304.

FIELD OF THE INVENTION

The present invention relates generally to semiconductor power devices, and more particularly to a semiconductor power device such as a MOSFET and other power devices that use floating islands of oppositely doped material to form the voltage sustaining layer.

BACKGROUND OF THE INVENTION

Semiconductor power devices such as vertical DMOS, V-groove DMOS, and trench DMOS MOSFETs, IGBTs as well as diodes and bipolar transistors are employed in applications such as automobile electrical systems, power supplies, motor drives, and other power control applications. Such devices are required to sustain high voltage in the off-state while having low on-resistance or a low voltage drop with high current density in the on-state.

FIG. 1 illustrates a typical structure for an N-channel power MOSFET. An N-epitaxial silicon layer 101 formed over an N+ doped silicon substrate 102 contains p-body regions 105a and 106a, and N+ source regions 107 and 108 for two MOSFET cells in the device. P-body regions 105 and 106 may also include deep p-body regions 105b and 106b. A source-body electrode 112 extends across certain surface portions of epitaxial layer 101 to contact the source and body regions. The N-type drain for both cells is formed by the portion of N-type epitaxial layer 101 extending to the upper semiconductor surface in FIG. 1. A drain electrode is provided at the bottom of N+ doped substrate 102. An insulated gate electrode 118 comprising insulating and conducting layers, e.g., oxide and polysilicon layers, lies over the channel and drain portions of the body.

The on-resistance of the conventional MOSFET shown in FIG. 1 is determined largely by the drift zone resistance in epitaxial layer 101. Epitaxial layer 101 is also sometimes referred to as a voltage sustaining layer since the reverse voltage applied between the N+ doped substrate and the P+ doped deep body regions is sustained by epitaxial layer 101. The drift zone resistance is in turn determined by the doping concentration and the thickness of epitaxial layer 101. However, to increase the breakdown voltage of the device, the doping concentration of epitaxial layer 101 must be reduced while the layer thickness is increased. The curve in FIG. 2 shows the on-resistance per unit area as a function of the breakdown voltage for a conventional MOSFET. Unfortunately, as the curve shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in Cezac et al., *Proceedings of the ISPSD*, May 2000, pp. 69–72, and Chen et al., *IEEE Transactions on Electron Devices*, Vol. 47, No. 6, June 2000, pp. 1280–1285, which are hereby incorporated by reference in their entirety. This MOSFET is similar to the conventional MOSFET shown in FIG. 1 except that it includes a series of vertically separated P– doped layers $310_1$, $310_2$, $310_3$, . . . $310_n$ (so-called "floating islands"), which are located in the drift region of the voltage sustaining layer 301. The floating islands $310_1$, $310_2$, $310_3$, . . . $310_n$ produce an electric field that is lower than for a structure with no floating islands. The lower electric field allows a higher dopant concentration to be used in the epitaxial layer that in part, forms the voltage sustaining layer 301. The floating islands produce a saw-shaped electric field profile, the integral of which leads to a sustained voltage obtained with a higher dopant concentration than the concentration used in conventional devices. This higher dopant concentration, in turn, produces a device having an on-resistance that is lower than that of a device without one or more layers of floating islands.

The structure shown in FIG. 3 can be fabricated with a process sequence that includes multiple epitaxial deposition steps, each followed by the introduction of the appropriate dopant. Unfortunately, epitaxial deposition steps are expensive to perform and thus a structure that uses multiple epitaxial deposition steps is expensive to manufacture.

Accordingly, it would be desirable to provide a method of fabricating a power semiconductor device such as the MOSFET structure shown in FIG. 3, which method requires a minimum number of epitaxial deposition steps so that the device can be produced less expensively.

SUMMARY OF THE INVENTION

In accordance with the present invention, a method is provided for forming a power semiconductor device. The method begins by providing a substrate of a first conductivity type and then forming a voltage sustaining region on the substrate. The voltage sustaining region is formed by depositing an epitaxial layer of a first conductivity type on the substrate and forming at least one trench in the epitaxial layer. A barrier material is deposited along the walls of the trench. A dopant of a second conductivity type is implanted through the barrier material into a portion of the epitaxial layer adjacent to and beneath the bottom of the trench. The dopant is diffused to form a first doped layer in the epitaxial layer and the barrier material is removed from at least the bottom of the trench. The trench is etched through the first doped layer and a filler material is deposited in the trench to substantially fill the trench, thus completing the voltage sustaining region. At least one region of the second conductivity type is formed over the voltage sustaining region to define a junction therebetween.

The power semiconductor device formed by the inventive method may be selected from the group consisting of a vertical DMOS, V-groove DMOS, and a trench DMOS MOSFET, an IGBT, a bipolar transistor, and diodes.

In accordance with another aspect of the invention, a power semiconductor device is provided. The device includes a substrate of a first conductivity type and a voltage sustaining region disposed on the substrate. The voltage sustaining region includes an epitaxial layer having a first conductivity type and at least one trench located in the epitaxial layer. At least one doped layer having a dopant of a second conductivity type is located in the epitaxial layer, adjacent a sidewall of the trench. A filler material is also provided, which substantially fills the trench. At least one region of the second conductivity is disposed over the voltage sustaining region to define a junction therebetween.

DETAILED DESCRIPTION

In accordance with the present invention, a method of forming the p-type floating islands in the voltage sustaining layer of a semiconductor power device may be generally described as follows. First, one or more trenches are etched in the epitaxial layer that is to form the voltage sustaining region of the device. Each trench is centered where the vertical series of islands is to be located. A first horizontal plane of such islands is formed by implanting p-type dopant material into the bottom of the trench. The implanted material is diffused into the portion of the voltage sustaining region located immediately adjacent to and below the trench bottom. The trenches are subsequently etched to a greater depth so that a second horizontal plane of floating islands can be formed by again implanting and diffusing a p-type dopant material. This second etching step form floating islands that have the shape of donut (when the trenches are circular) and which are located in the first horizontal plane. If the trenches have a shape other than circular, e.g., square, rectangular, or hexagonal, the shape of the trench determines the shape of the floating islands. The aforementioned process is repeated until the desired number of vertical layers of islands have been formed. Finally, the trenches are filled with a material that does not adversely affect the characteristics of the device. Exemplary materials that may be used for the material filling the trenches include highly resistive polysilicon, a dielectric such as silicon dioxide, or other materials and combinations of materials.

Figure 1:
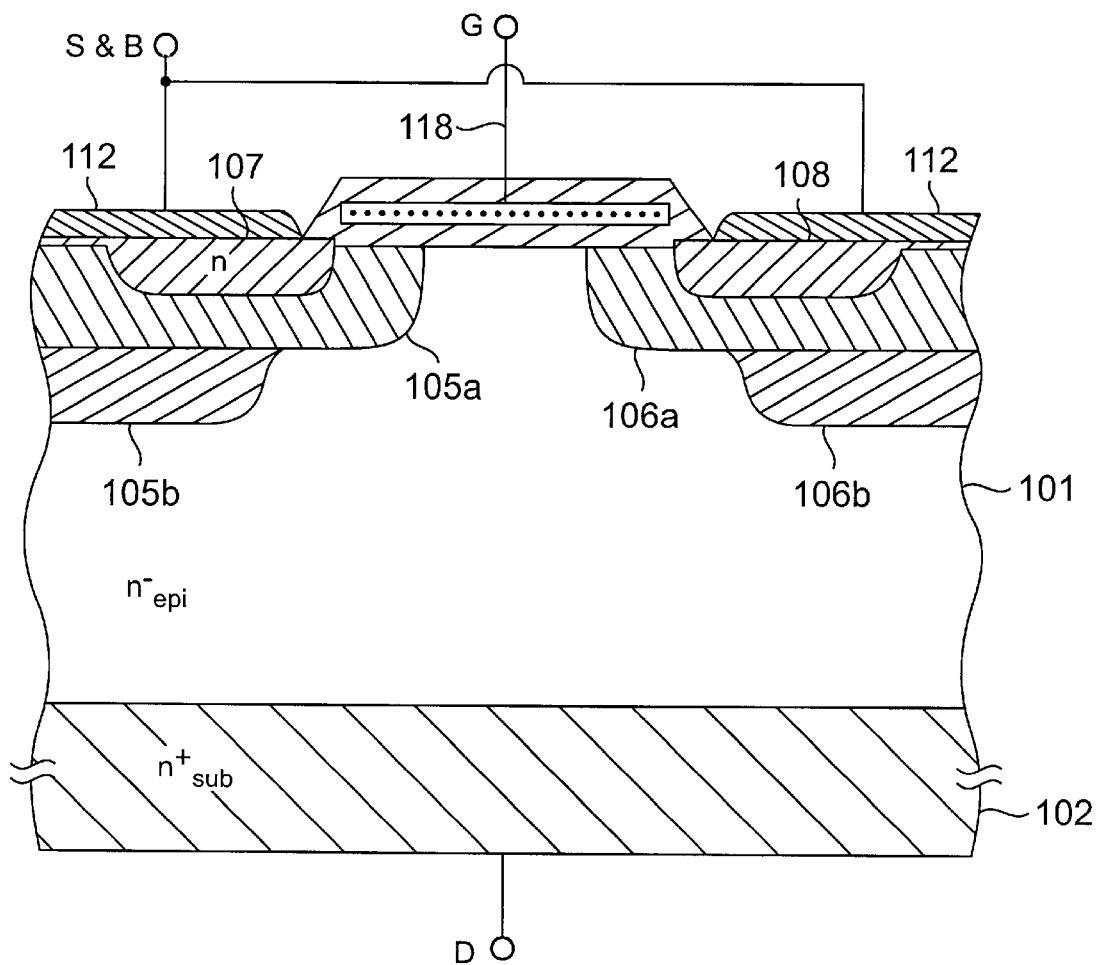
FIG. 1 shows a cross-sectional view of a conventional power MOSFET structure.
Figure 2:
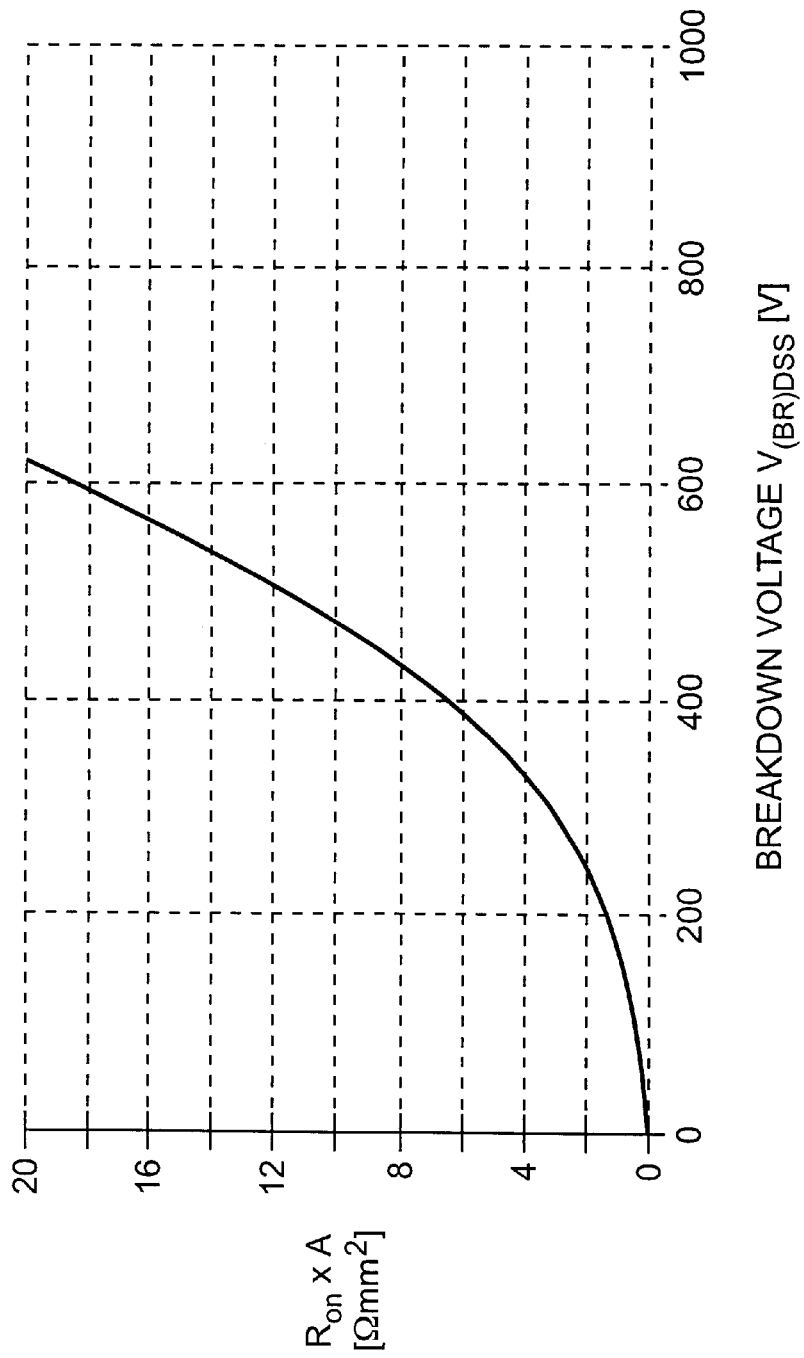
FIG. 2 shows the on-resistance per unit area as a function of the breakdown voltage for a conventional power MOSFET.
Figure 3:
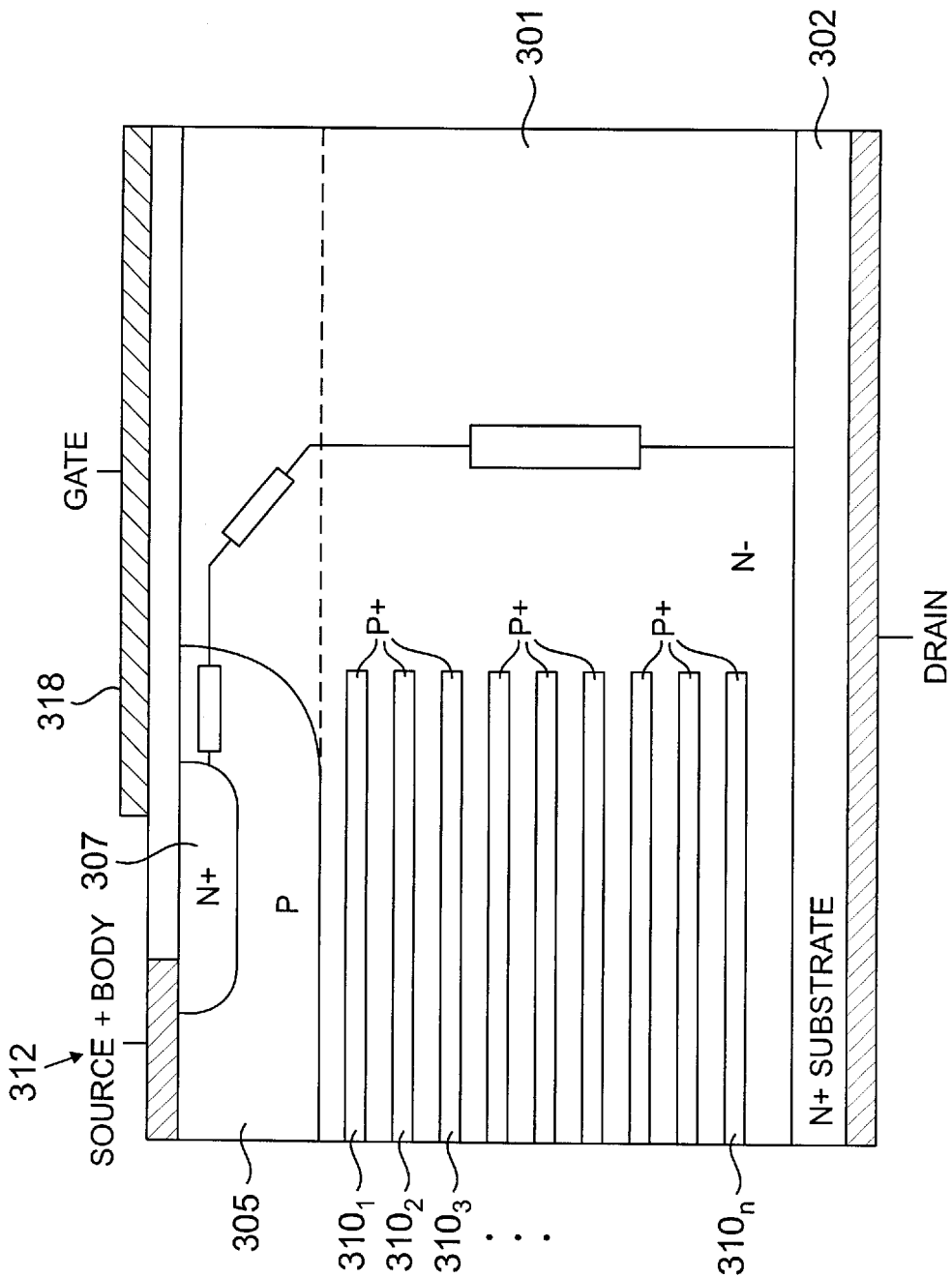
FIG. 3 shows a MOSFET structure that includes a voltage sustaining region with floating islands located below the body region, which is designed to operate with a lower on-resistance per unit area at the same voltage than the structure depicted in FIG. 1.
Figure 4:
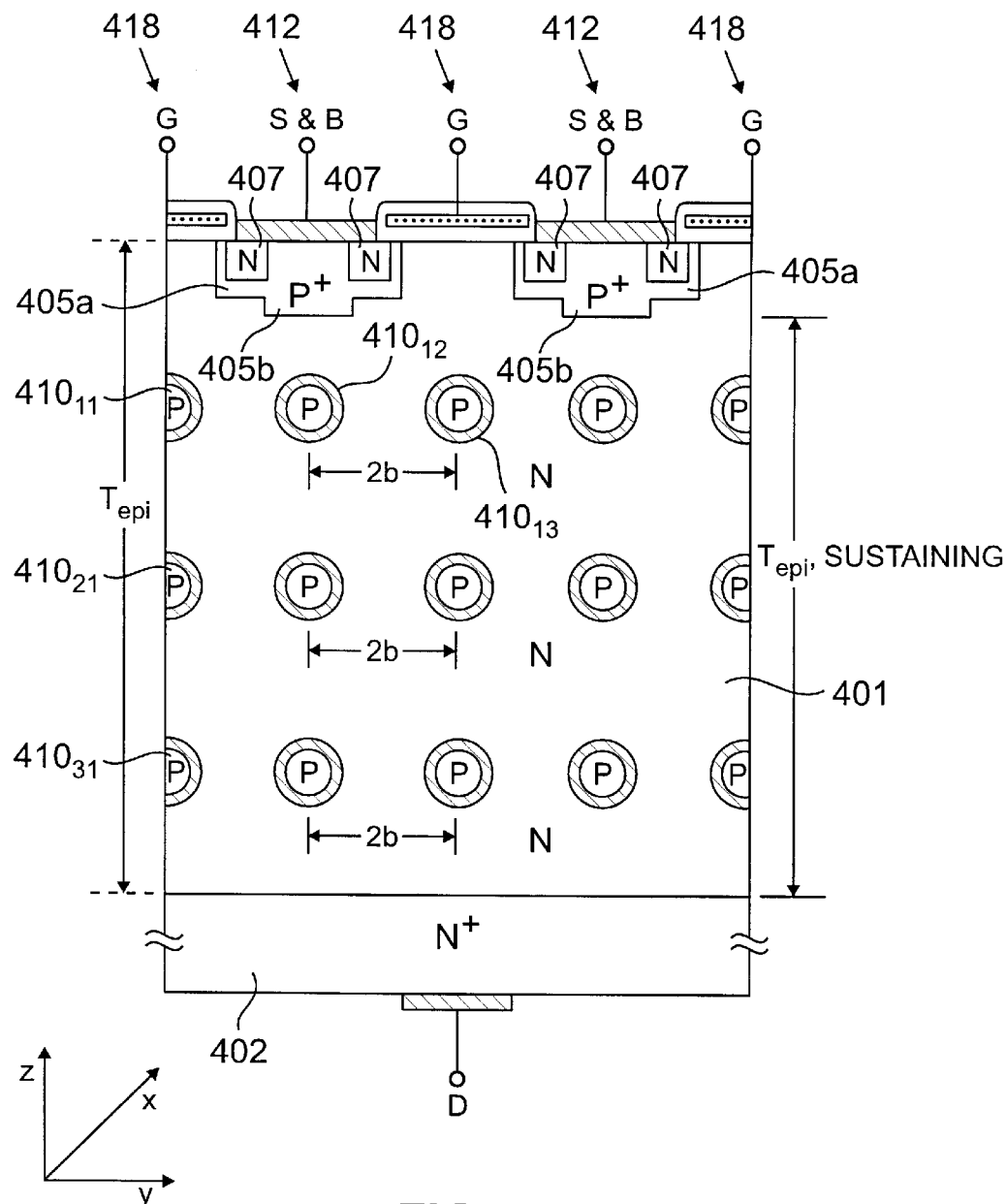
FIG. 4 shows a MOSFET structure that includes a voltage sustaining region with floating islands both below and between the body regions.

FIG. 4 shows a power semiconductor device constructed in accordance with the present invention. In this embodiment of the invention the trenches are assumed to be circular and therefore the floating islands are depicted as donut-shaped. An N-type epitaxial silicon layer 401 formed over an N+ silicon substrate 402 contains P-body regions 405, and N+ source regions 407 for two MOSFET cells in the device. As shown, P-body regions 405a may also include deep P-body regions 405b. A source-body electrode 412 extends across certain surface portions of epitaxial layer 401 to contact the source and body regions. The N-type drain for both cells is formed by the portion of N-epitaxial layer 401 extending to the upper semiconductor surface. A drain electrode is provided at the bottom of N+ substrate 402. An insulated gate electrode 418 comprising oxide and polysilicon layers lies over the channel and drain portions of the body. A series of floating islands 410 are located in the voltage sustaining region of the device defined by epitaxial silicon layer 401. The floating islands are arranged in an array when viewed from the top of the device. For instance, in FIG. 4, in the "y" direction, floating islands are denoted by reference numerals $410_{11}, 410_{12}, 410_{13}, \ldots 410_{1m}$ and in the "z" direction floating islands are denoted by reference numerals $410_{11}, 410_{21}, 410_{31}, \ldots 410_{m1}$. While the column of floating islands 410 located below the gate 418 may or may not be employed, they are employed when required for the device geometry and the resistivity of epitaxial layer 401.

The power semiconductor device shown in FIG. 4 may be fabricated in accordance with the following exemplary steps, which are illustrated in FIGS. 5(a)–5(f).

First, the N-type doped epitaxial layer 501 is grown on a conventionally N+ doped substrate 502. Epitaxial layer 1 is typically 15–50 microns in thickness for a 400–800 V device with a resistivity of 5–40 ohm-cm. Next, a dielectric masking layer is formed by covering the surface of epitaxial layer 501 with a dielectric layer, which is then conventionally exposed and patterned to leave a mask portion that defines the location of the trench 520. The trench 520 is dry etched through the mask openings by reactive ion etching to an initial depth that may range from 5–15 microns. In particular, if "x" is the number of equally spaced horizontal rows of floating islands that are desired, the trench 520 should be initially etched to a depth of approximately $1/(x+1)$ of the thickness of epitaxial layer 502 that is to be between the bottom of the body region and the top of the N+ doped substrate. The sidewalls of each trench may be smoothed, if needed. First, a dry chemical etch may be used to remove a thin layer of oxide (typically about 500–1000 A) from the trench sidewalls to eliminate damage caused by the reactive ion etching process. Next, a sacrificial silicon dioxide layer is grown over the trench The sacrificial layer is removed either by a buffer oxide etch or an HF etch so that the resulting trench sidewalls are as smooth as possible.

Figure 5A:
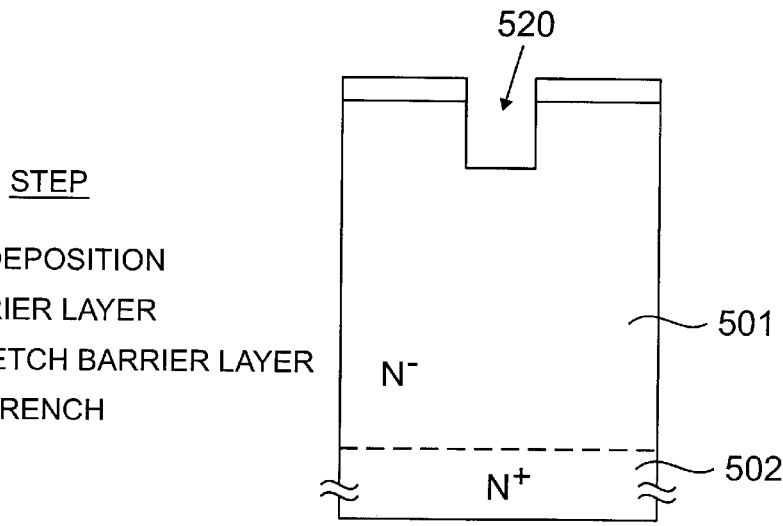
FIGS. 5(a)–5(f) show a sequence of exemplary process steps that may be employed to fabricate a voltage sustaining region constructed in accordance with the present invention.
Figure 5B:
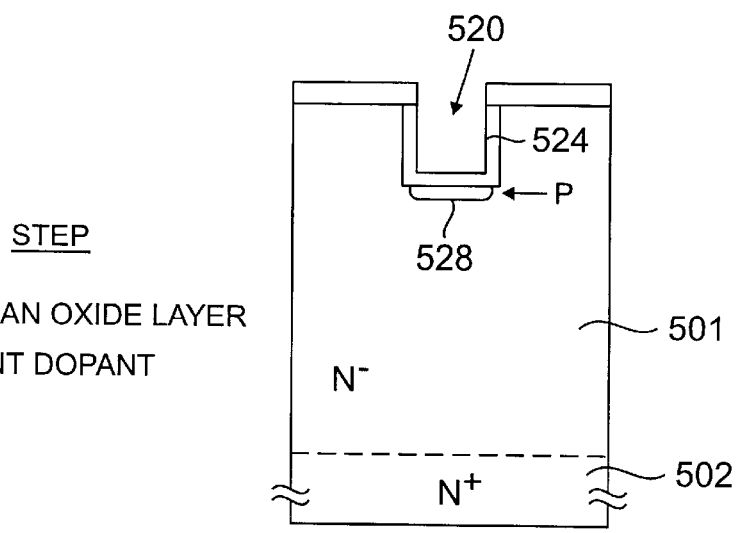
Figure 5C:
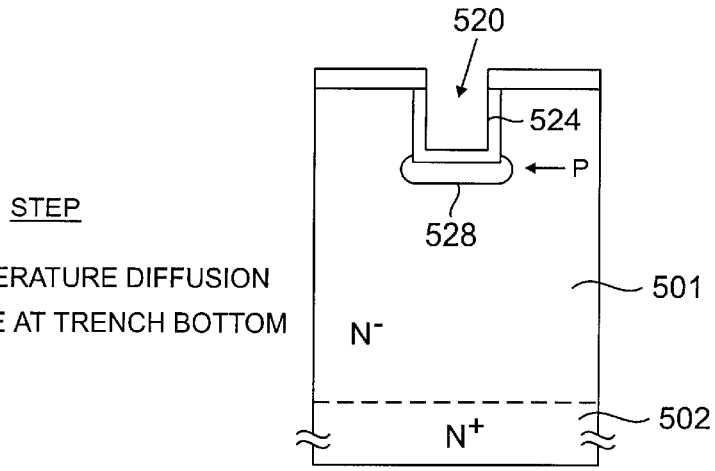

In FIG. 5(b), a layer of silicon dioxide 524 is grown in trench 520. The thickness of the silicon dioxide layer 524 should be sufficient to prevent implanted atoms from penetrating the silicon adjacent to and below the sidewalls of the trench 520, while allowing the implanted atoms to penetrate the oxide layer 524 at the bottom of the trench 520 so that they can be deposited into the silicon adjacent and beneath the trench bottom. Next, a dopant 528 such as boron is implanted through the oxide layer at the bottom of the trench 520. The total dose of dopant and the implant energy should be chosen such that the amount of dopant left in the epitaxial layer 501 after the subsequent diffusion and etching steps are performed at each horizontal level satisfies the breakdown requirements of the resulting device. Next, in FIG. 5(c), a high temperature diffusion step is performed to "drive-in" the implanted dopant 528 both vertically and laterally. Oxide layer 524 is removed from the bottom of the trench 520. The oxide layer 524 may or may not be removed from the sidewalls of the trench 520.

Figure 5D:
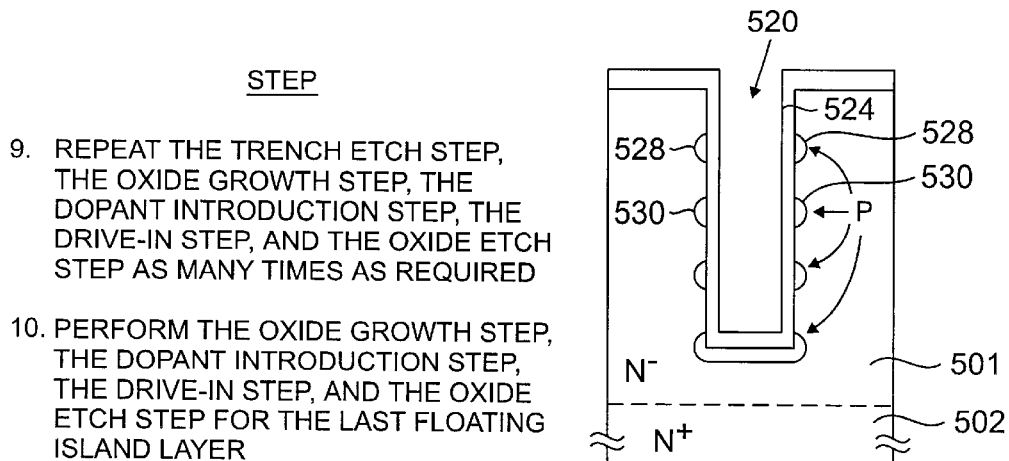
Figure 5E:
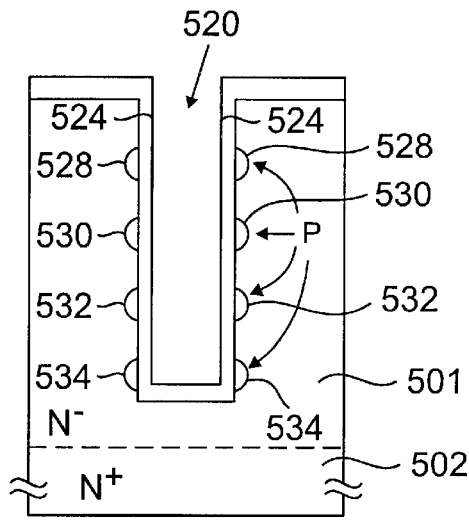

In FIG. 5(d), the depth of the trench 520 is increased by an amount approximately equal to $1/(x+1)$ of the thickness of epitaxial layer 501 that is located between the bottom of the body region and the N+-doped substrate. Next, a second horizontal layer of floating islands 530 is fabricated by repeating the steps of growing an oxide layer on the trench walls, implanting and diffusing dopant through the bottom of the trench, and removing the oxide layer from the bottom of the trench. This process can be repeated as many times as necessary to form "x" horizontal layers of floating islands, where "x" is selected to provide the desired breakdown voltage. For example, in FIG. 5(d), four such horizontal layers 528, 530, 532, and 534 are shown. As shown in FIG.

5(e), once the last array of horizontal floating islands is formed, the trench depth is increased by an amount sufficient to etch through the last horizontal array of floating islands. If only a single horizontal array of floating islands is employed, in some embodiments of the invention it will not be necessary to etch through the array Finally, the trench 520 is filled with a material that does not adversely affect the characteristics of the device. Exemplary materials include, but are not limited to, thermally grown silicon dioxide, a deposited dielectric such as silicon dioxide, silicon nitride, or a combination of thermally grown and deposited layers of these or other materials. Finally, the surface of the structure is planarized as shown in FIG. 5(f).

Figure 5F:
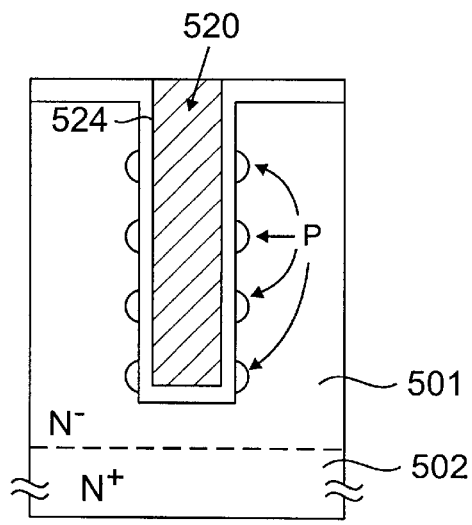

The aforementioned sequence of processing steps resulting in the structure depicted in FIG. 5(f) provides a voltage sustaining layer with floating islands on which any of a number of different power semiconductor devices can be fabricated. As previously mentioned, such power semiconductor devices include vertical DMOS, V-groove DMOS, and trench DMOS MOSFETs, IGBTs and other MOS-gated devices. For instance, FIG. 4 shows an example of a MOSFET that includes a voltage sustaining layer with floating islands constructed in accordance with the principles of the present invention. It should be noted that while FIG. 5 shows a single trench that is used to form a column of donut-shaped floating islands, the present invention encompasses a voltage sustaining regions having single or multiple trenches to form any number of columns of floating islands having a variety of different shapes.

Once the voltage sustaining region and the floating islands have been formed as shown in FIG. 5, the MOSFET shown in FIG. 4 can be completed in the following manner. The gate oxide is grown after an active region mask is formed. Next, a layer of polycrystalline silicon is deposited, doped, and oxidized. The polysilcon layer is then masked to form the gate regions. The p+ doped deep body regions 405b are formed using conventional masking, implantation and diffusion steps. For example, the p+-doped deep body regions are boron implanted at 20 to 200 KeV with a dosage from about $1 \times 10^{14}$ to $5 \times 10^{15}/cm^2$. The shallow body region 405a is formed in a similar fashion. The implant dose for this region will be $1 \times 10^{13}$ to $5 \times 10^{14}/cm^2$ at an energy of 20 to 100 KeV.

Next, a photoresist masking process is used to form a patterned masking layer that defines source regions 407. Source regions 407 are then formed by an implantation and diffusion process. For example, the source regions may be implanted with arsenic at 20 to 100 KeV to a concentration that is typically in the range of $2 \times 10^{15}$ to $1.2 \times 10^{16}/cm^2$. After implantation, the arsenic is diffused to a depth of approximately 0.5 to 2.0 microns. The depth of the body region typically ranges from about 1–3 microns, with the P+ doped deep body region (if present) being slightly deeper. Finally, the masking layer is removed in a conventional manner. The DMOS transistor is completed in a conventional manner by etching the oxide layer to form contact openings on the front surface. A metallization layer is also deposited and masked to define the source-body and gate electrodes. Also, a pad mask is used to define pad contacts. Finally, a drain contact layer is formed on the bottom surface of the substrate.

It should be noted that while a specific process sequence for fabricating the power MOSFET is disclosed, other process sequences may be used while remaining within the scope of this invention. For instance, the deep p+ doped body region may be formed before the gate region is defined. It is also possible to form the deep p+ doped body region prior to forming the trenches. In some DMOS structures, the P+ doped deep body region may be shallower than the P-doped body region, or in some cases, there may not even be a P+ doped body region.

Although various embodiments are specifically illustrated and described herein, it will be appreciated that modifications and variations of the present invention are covered by the above teachings and are within the purview of the appended claims without departing from the spirit and intended scope of the invention. For example, a power semiconductor device in accordance with the present invention may be provided in which the conductivities of the various semiconductor regions are reversed from those described herein. Moreover, while a vertical DMOS transistor has been used to illustrate exemplary steps required to fabricate a device in accordance with the present invention, other DMOS FETs and other power semiconductor devices such as diodes, bipolar transistors, power JFETs, IGBTs, MCTs, and other MOS-gated power devices may also be fabricated following these teachings.

What is claimed is:

1. A power semiconductor device made in accordance with a method comprising the steps of:
    A. providing a substrate of a first conductivity type;
    B. forming a voltage sustaining region on said substrate by:
        1. depositing an epitaxial layer on the substrate, said epitaxial layer having a first conductivity type;
        2. forming at least one trench in said epitaxial layer;
        3. depositing a barrier material along the walls of said trench;
        4. implanting a dopant of a second conductivity type through the barrier material into a portion of the epitaxial layer adjacent to and beneath the bottom of said trench;
        5. diffusing said dopant to form a first doped layer in said epitaxial layer;
        6. removing the barrier material from at least the bottom of the trench;
        7. etching the trench through said first doped layer; and
        8. depositing a filler material in said trench to substantially fill said trench; and
    C. forming over said voltage sustaining region at least one region of said second conductivity type to define a junction therebetween.

2. A power semiconductor device made in accordance with a method comprising the steps of:
    A. providing a substrate of a first conductivity type;
    B. forming a voltage sustaining region on said substrate by:
        1. depositing an epitaxial layer on the substrate, said epitaxial layer having a first conductivity type;
        2. forming at least one trench in said epitaxial layer;
        3. depositing a barrier material along the walls of said trench;
        4. implanting a dopant of a second conductivity type through the barrier material into a portion of the epitaxial layer adjacent to and beneath the bottom of said trench;
        5. diffusing said dopant to form a first doped layer in said epitaxial layer;
        6. removing the barrier material from at least the bottom of the trench;
        7. etching the trench through said first doped layer; and
        8. depositing a filler material in said trench to substantially fill said trench; and C. forming over said voltage sustaining region at least one region of said second conductivity type to define a junction therebetween, wherein said epitaxial layer has a given thickness and further comprising the steps of:

D. etching the trench by an additional amount substantially equal to 1/(x+1) of said given thickness, where x is equal to or greater than two and corresponds to a prescribed number of doped layers to be formed in the voltage sustaining region;

E. repeating steps (B.3)–(B.6) to form another doped layer vertically below said first doped layer; and F. repeating steps D-E until the prescribed number of doped layers have been formed; and G. etching the trench through the xth layer of said doped layers.

3. A power semiconductor device made in accordance with a method comprising the steps of:

A. providing a substrate of a first conductivity type;

B. forming a voltage sustaining region on said substrate by:
1. depositing an epitaxial layer on the substrate, said epitaxial layer having a first conductivity type;
2. forming at least one trench in said epitaxial layer;
3. depositing a barrier material along the walls of said trench;
4. implanting a dopant of a second conductivity type through the barrier material into a portion of the epitaxial layer adjacent to and beneath the bottom of said trench;
5. diffusing said dopant to form a first doped layer in said epitaxial layer;
6. removing the barrier material from at least the bottom of the trench;
7. etching the trench through said first doped layer; and
8. depositing a filler material in said trench to substantially fill said trench; and C. forming over said voltage sustaining region at least one region of said second conductivity type to define a junction therebetween,
wherein said power semiconductor device is selected from the group consisting of a vertical DMOS, V-groove DMO, and a trench DMOS MOSFET, an IGBT, and a bipolar transistor.

4. A power semiconductor device comprising:

a substrate of a first conductivity type;

a voltage sustaining region disposed on said substrate, said voltage sustaining region including:
an epitaxial layer having a first conductivity type;
at least one trench located in said epitaxial layer;
at least one doped layer having a dopant of a second conductivity type, said doped layer being located in said epitaxial layer adjacent a sidewall of said trench;
a filler material substantially filling said trench; and
at least one region of said second conductivity disposed over said voltage sustaining region to define a junction therebetween.

5. The device of claim 4 wherein said at least one doped layer includes a plurality of doped layers, each of said doped layers being located in a vertical column with respect to one another.

6. The device of claim 4 wherein said at least one region further includes:
a gate dielectric and a gate conductor disposed above said gate dielectric;
first and second body regions located in the epitaxial layer to define a drift region therebetween, said body regions having a second conductivity type; and
first and second source regions of the first conductivity type located in the first and second body regions, respectively.

7. A power semiconductor device made in accordance with a method comprising the steps of:

A. providing a substrate of a first conductivity type;

B. forming a voltage sustaining region on said substrate by:
1. depositing an epitaxial layer on the substrate, said epitaxial layer having a first conductivity type;
2. forming at least one trench in said epitaxial layer;
3. depositing a barrier material along the walls of said trench;
4. implanting a dopant of a second conductivity type through the barrier material into a portion of the epitaxial layer adjacent to and beneath the bottom of said trench;
5. diffusing said dopant to form a first doped layer in said epitaxial layer;
6. removing the barrier material from at least the bottom of the trench;
7. etching the trench through said first doped layer; and
8. depositing a filler material in said trench to substantially fill said trench; and C. forming over said voltage sustaining region at least one region of said second conductivity type to define a junction therebetween,
wherein said material filling the trench is a dielectric material.

8. The device of claim 7 wherein said dielectric material is silicon dioxide.

9. The device of claim 7 wherein said dielectric material is silicon nitride.

10. The device of claim 4 wherein said dopant is boron.

11. The device of claim 6 wherein said body regions include deep body regions.

12. The device of claim 4 wherein said trench has a circular cross-section.

13. The device of claim 12 wherein said at least one doped layer is donut-shaped.

14. The device of claim 5 wherein at least one of the plurality of doped layers is donut-shaped.

15. The device of claim 4 wherein said trench has a cross-sectional shape selected from the group consisting of a square, rectangle, octagon and a hexagon.

* * * * *

UNITED STATES PATENT AND TRADEMARK OFFICE
CERTIFICATE OF CORRECTION

PATENT NO.   : 6,624,494 B2
DATED        : September 23, 2003
INVENTOR(S)  : Richard A. Blanchard It is certified that error appears in the above-identified patent and that said Letters Patent is hereby corrected as shown below:

Column 1,
Line 30, after "for an", change "N-channel" to -- n-channel --.
Line 31, after "An", change "N-epitaxial" to -- n-epitaxial --.
Line 32, after "an", change "N+ doped" to -- n+ doped --.
Line 33, after "and", first occurrence, change "N+" to -- n+ --.
Line 38, after "The", change "N-type" to -- n-type --.
Line 39, after "portion of", change "N-type" to -- n-type --.
Line 41, after "bottom of", change "N+" to -- n+ --.
Line 49, after "the", first occurrence, change "N+" to -- n+ --, and after "the", second occurrence, change "P+" to -- p+ --.

Column 3,
Line 36, after "step", change "form" to -- forms --.

Signed and Sealed this

Fifteenth Day of February, 2005

JON W. DUDAS
*Director of the United States Patent and Trademark Office*